US011435698B2

(12) United States Patent
Yamazaki

(10) Patent No.: US 11,435,698 B2
(45) Date of Patent: *Sep. 6, 2022

(54) ELECTRONICALLY CONTROLLED MECHANICAL WATCH AND METHOD FOR CONTROLLING ELECTRONICALLY CONTROLLED MECHANICAL WATCH

(71) Applicant: Seiko Epson Corporation, Tokyo (JP)

(72) Inventor: Yutaka Yamazaki, Okaya (JP)

(73) Assignee: Seiko Epson Corporation

( * ) Notice: Subject to any disclaimer, the term of this patent is extended or adjusted under 35 U.S.C. 154(b) by 187 days.

This patent is subject to a terminal disclaimer.

(21) Appl. No.: 16/931,531

(22) Filed: Jul. 17, 2020

(65) Prior Publication Data

US 2021/0018874 A1 Jan. 21, 2021

(30) Foreign Application Priority Data

Jul. 18, 2019 (JP) ............................ JP2019-132459

(51) Int. Cl.

*G04B 17/22* (2006.01)
*H03B 5/04* (2006.01)
*H02J 7/34* (2006.01)

(52) U.S. Cl.

CPC .............. *G04B 17/22* (2013.01); *H02J 7/345* (2013.01); *H03B 5/04* (2013.01)

(58) Field of Classification Search

CPC ...................................................... G04B 17/22
USPC .......................................................... 368/202
See application file for complete search history.

(56) References Cited

U.S. PATENT DOCUMENTS 11,249,441 B2 * 2/2022 Yamazaki .............. G04B 17/22

FOREIGN PATENT DOCUMENTS

JP 2000-346962 A 12/2000
JP 2009-038432 A 2/2009
JP 2013-150344 A 8/2013
JP 2016-032196 A 3/2016

* cited by examiner

*Primary Examiner* — Joseph Chang
(74) *Attorney, Agent, or Firm* — Harness, Dickey & Pierce, P.L.C.

(57) ABSTRACT

An electronically controlled mechanical watch includes a mechanical energy source, a power generator including a rotor driven by the mechanical energy source, a capacitor configured to be chargeable and accumulate electrical energy generated by the power generator, and a crystal oscillation circuit including a crystal oscillator and an oscillation circuit and configured to stop oscillating when a voltage of the capacitor falls below an oscillation stop voltage and to start oscillating when the voltage exceeds an oscillation start voltage higher than the oscillation stop voltage. The watch also includes a temperature compensation circuit configured to perform a temperature compensation function operation compensating for variation of a reference signal due to a temperature, a first voltage detection circuit configured to detect that the voltage exceeded a first voltage that is set higher than the oscillation start voltage, and a control circuit configured to stop the temperature compensation function operation of the temperature compensation circuit until the first voltage detection circuit detects that the voltage exceeded the first voltage.

9 Claims, 11 Drawing Sheets

ELECTRONICALLY CONTROLLED MECHANICAL WATCH AND METHOD FOR CONTROLLING ELECTRONICALLY CONTROLLED MECHANICAL WATCH

The present application is based on, and claims priority from JP Application Serial Number 2019-132459, filed Jul. 18, 2019, the disclosure of which is hereby incorporated by reference herein in its entirety.

BACKGROUND

1. Technical Field

The present invention relates to an electronically controlled mechanical watch and a method for controlling an electronically controlled mechanical watch.

2. Related Art

In JP-A-2000-346962, an electronically controlled mechanical watch is disclosed in which an electrical circuit is charged by electrical energy generated as a result of driving a power generator using mechanical energy generated when a mainspring is opened, and, by operating a braking control circuit using the electrical energy and controlling rotation of a rotor of the power generator, the electronically controlled mechanical watch drives hands fixed to a train wheel and displays the time.

In the electronically controlled mechanical watch disclosed in JP-A-2000-346962, a charge generated by the power generator accumulates in a power supply capacitor, is smoothed, and is caused to operate a rotary control device. In this case, there are times when a heavy-load operation is performed, such as a temperature compensation function operation that compensates for the temperature characteristics and the like of the crystal oscillator, in a state in which the charge is not sufficiently accumulated in the power supply capacitor. If this is done, when performing the temperature compensation function operation, the charge accumulated in the power supply capacitor is discharged, a power supply voltage falls below an operation stop voltage of the rotary control device, and there is a possibility that the electronically controlled mechanical watch cannot be controlled.

SUMMARY

An electronically controlled mechanical watch according to an aspect of the present disclosure includes a mechanical energy source, a power generator including a rotor driven by the mechanical energy source, a capacitor configured to be chargeable and accumulate electrical energy generated by the power generator, a crystal oscillation circuit including a crystal oscillator and an oscillation circuit and configured to stop oscillation when a voltage of the capacitor falls below an oscillation stop voltage, and to start oscillation when the voltage exceeds an oscillation start voltage, which is higher than the oscillation stop voltage, a divider circuit configured to output a reference signal by dividing an oscillation signal output from the oscillation circuit, a temperature compensation circuit configured to perform a temperature compensation function operation that compensates for variation of the reference signal due to a temperature, a first voltage detection circuit configured to detect that the voltage exceeded a first voltage that is set higher than the oscillation start voltage, and a control circuit configured to stop the temperature compensation function operation of the temperature compensation circuit until the first voltage detection circuit detects that the voltage exceeded the first voltage.

In the electronically controlled mechanical watch according to the aspect of the present disclosure, the control circuit may start the temperature compensation function operation of the temperature compensation circuit when the first voltage detection circuit detects that the voltage exceeded the first voltage, and may subsequently continue the temperature compensation function operation even when the voltage falls below the first voltage.

The electronically controlled mechanical watch according to the aspect of the present disclosure may include an oscillation stop detection circuit configured to detect an oscillation stop of the crystal oscillation circuit, and the control circuit may stop the temperature compensation function operation when the oscillation stop of the crystal oscillation circuit is detected by the oscillation stop detection circuit.

The electronically controlled mechanical watch according to the aspect of the present disclosure may include a storage circuit configured to store detection by the first voltage detection circuit that the voltage exceeded the first voltage. The control circuit may initialize the storage circuit when the oscillation stop of the crystal oscillation circuit is detected by the oscillation stop detection circuit, and may stop the temperature compensation function operation when the storage circuit is initialized.

The electronically controlled mechanical watch according to the aspect of the present disclosure may include a second voltage detection circuit configured to detect that the voltage fell below a second voltage that is set lower than the first voltage. The control circuit may stop the temperature compensation function operation when the second voltage detection circuit detects that the voltage fell below the second voltage.

The electronically controlled mechanical watch according to the aspect of the present disclosure may include a storage circuit configured to store detection by the first voltage detection circuit that the voltage exceeded the first voltage. The control circuit may initialize the storage circuit when the second voltage detection circuit detects that the voltage fell below the second voltage, and may stop the temperature compensation function operation of the temperature compensation circuit when the storage circuit is initialized.

In the electronically controlled mechanical watch according to the aspect of the present disclosure, the temperature compensation circuit may be configured to perform an individual difference correction function operation that corrects an individual difference of the crystal oscillator, and the control circuit may continue the individual difference correction function operation by the temperature compensation circuit when the temperature compensation function operation of the temperature compensation circuit is stopped.

In the electronically controlled mechanical watch according to the aspect of the present disclosure, the first voltage may be set such that the voltage does not fall below the oscillation stop voltage due to the temperature compensation function operation, when the control circuit starts the temperature compensation function operation of the temperature compensation circuit.

A method for controlling an electronically controlled mechanical watch according to an aspect of the present disclosure is a method for control an electronically controlled mechanical watch that includes mechanical energy source, a power generator including a rotor driven by the mechanical energy source, a capacitor configured to be chargeable and accumulate electrical energy generated by the power generator, a crystal oscillation circuit including a crystal oscillator and an oscillation circuit and configured to stop oscillation when a voltage of the capacitor falls below an oscillation stop voltage and start oscillation when the voltage exceeds an oscillation start voltage, which is higher than the oscillation stop voltage, a divider circuit configured to output a reference signal by dividing an oscillation signal output from the oscillation circuit, a temperature compensation circuit configured to perform a temperature compensation function operation that compensates for variation of the reference signal due to a temperature, and a first voltage detection circuit configured to detect that the voltage exceeded a first voltage that is set higher than the oscillation start voltage. The control method includes stopping the temperature compensation function operation of the temperature compensation circuit until the first voltage detection circuit detects that the voltage exceeded the first voltage.

DESCRIPTION OF EXEMPLARY EMBODIMENTS

First Embodiment

A first embodiment of the present disclosure will be described below with reference to the drawings.

Figure 1:
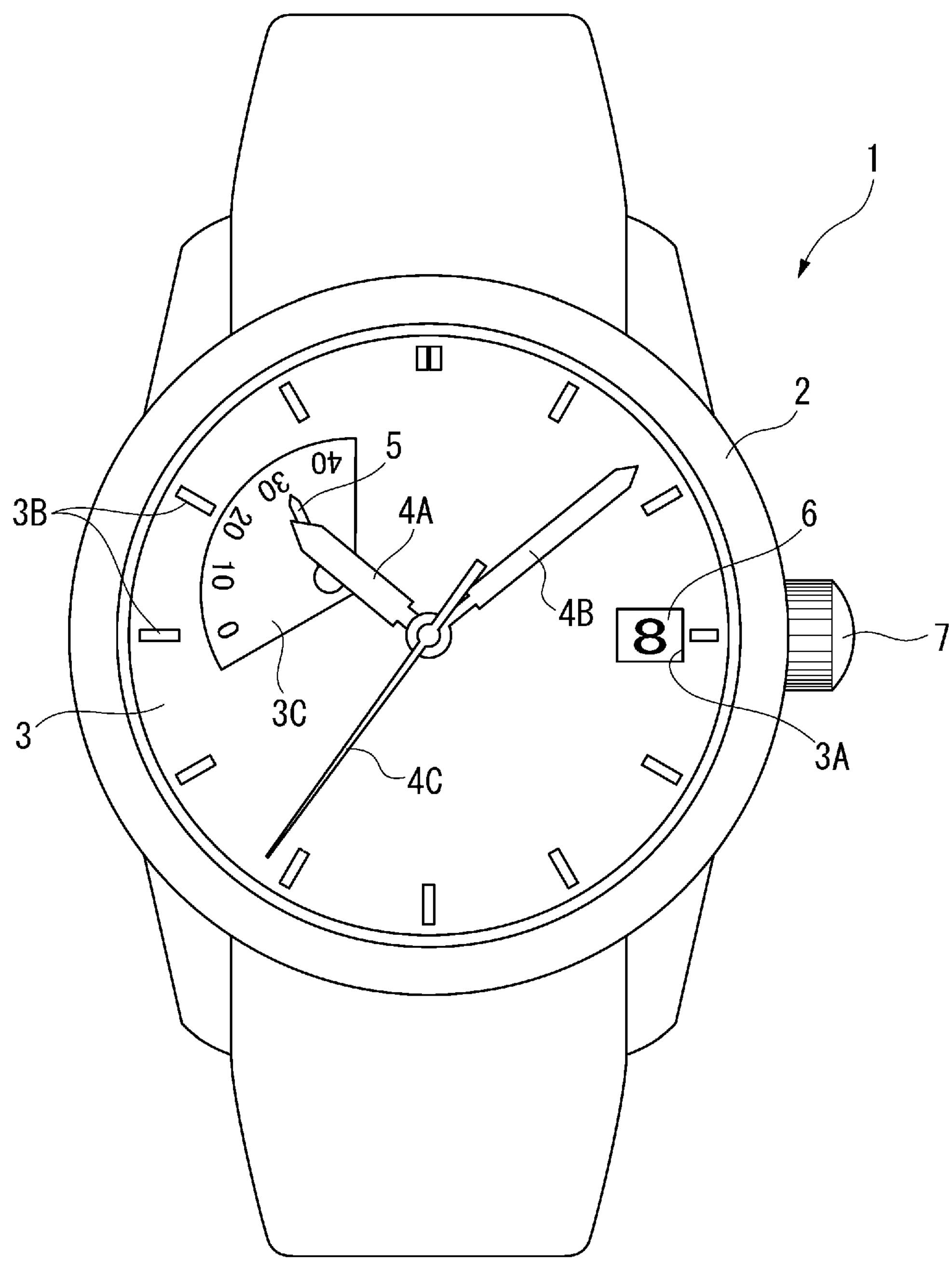
FIG. 1 is a front view illustrating a watch according to a first embodiment.

FIG. 1 is a front view illustrating a watch 1. In the present embodiment, the watch 1 is configured as an electronically controlled mechanical watch. That is, the watch 1 is an example of the electronically controlled mechanical watch of the present disclosure.

As illustrated in FIG. 1, the watch 1 is a wristwatch mounted on a user's wrist and is provided with a cylindrical outer case 2. A dial 3 is disposed on an inner circumferential side of the outer case 2. Of two openings of the outer case 2, an opening on the front surface side is blocked by a cover glass, and an opening on the rear surface side is blocked by a case back.

The watch 1 is provided with a movement (not illustrated) housed inside the outer case 2, and an hour hand 4A, a minute hand 4B, and a second hand 4C that display time information. A small calendar window 3A is provided in the dial 3, and a date indicator 6 is visible from the small calendar window 3A. Further, the dial 3 is provided with hour marks 3B for indicating the time, and a fan-shaped subdial 3C indicating a time duration, using a power reserve hand 5.

A crown 7 is provided on the side surface of the outer case 2. The crown 7 can be pulled out and moved from a 0th stage position, in which the crown 7 is pushed in toward the center of the watch 1, to a first stage position and a second stage position.

When the crown 7 is pulled out to the first stage position and rotated, the date can be adjusted by moving the date indicator 6. When the crown 7 is pulled out to the second stage position, the second hand 4C stops, and when the crown 7 is rotated at the second stage position, the time can be adjusted by moving the hour hand 4A and the minute hand 4B. The method for adjusting the date indicator 6, the hour hand 4A, and the minute hand 4B using the crown 7 is the same as in a watch of related art, and a description thereof will thus be omitted here.

Further, when the crown 7 is rotated in the 0th stage position, a mainspring 40 to be described later can be wound. Then, the power reserve hand 5 moves in conjunction with the winding of the mainspring 40. When the mainspring 40 is fully wound, the watch 1 according to the present embodiment can secure a time duration of approximately 40 hours.

Schematic Configuration of Watch

Figure 2:
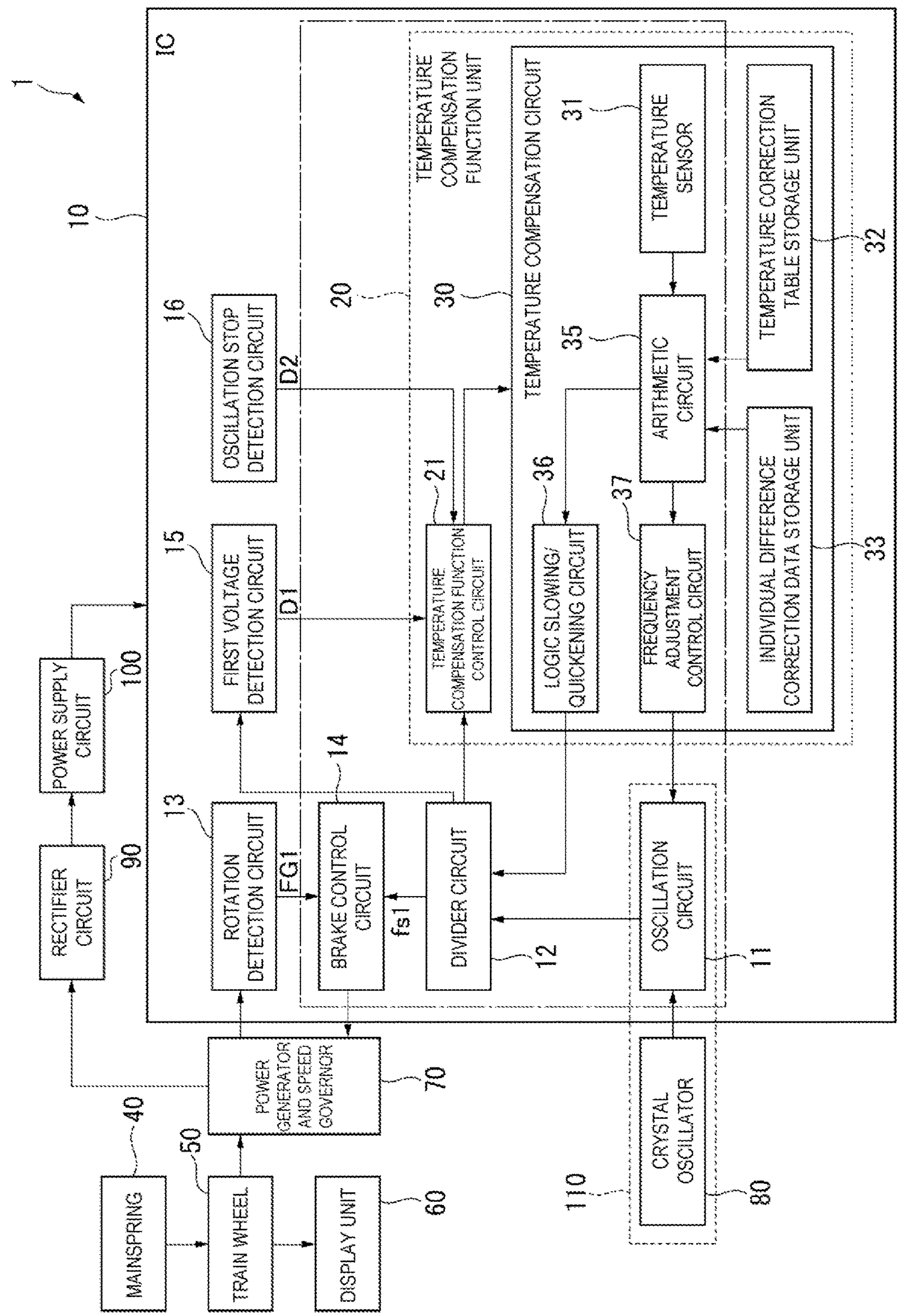
FIG. 2 is a block diagram illustrating a schematic configuration of the watch according to the first embodiment.

FIG. 2 is a block diagram illustrating a schematic configuration of the watch 1.

As illustrated in FIG. 2, the watch 1 is provided with an IC 10, the mainspring 40, a train wheel 50, a display unit 60, a power generator 70, a crystal oscillator 80, a rectifier circuit 90, and a power supply circuit 100. Note that the mainspring 40 is an example of a mechanical energy source of the present disclosure. Also, in the present embodiment, the watch 1 is a so-called annual-difference clock that configured to be able to maintain time accuracy.

The crystal oscillator 80 is driven by an oscillation circuit 11 to be described below, and generates an oscillation signal.

The train wheel 50 couples the mainspring 40 and a rotor 71 of the power generator 70 to be described below. Furthermore, the train wheel 50 couples the rotor 71 to the hands 4A to 4C and the hand 5 illustrated in FIG. 1. In this way, the mainspring 40 drives the hands 4A to 4C and the hand 5 via the train wheel 50.

The display unit 60 is configured by the hands 4A to 4C illustrated in FIG. 1, and displays the time. Further, the display unit 60 includes the power reserve hand 5.

Power Generator

Figure 3:
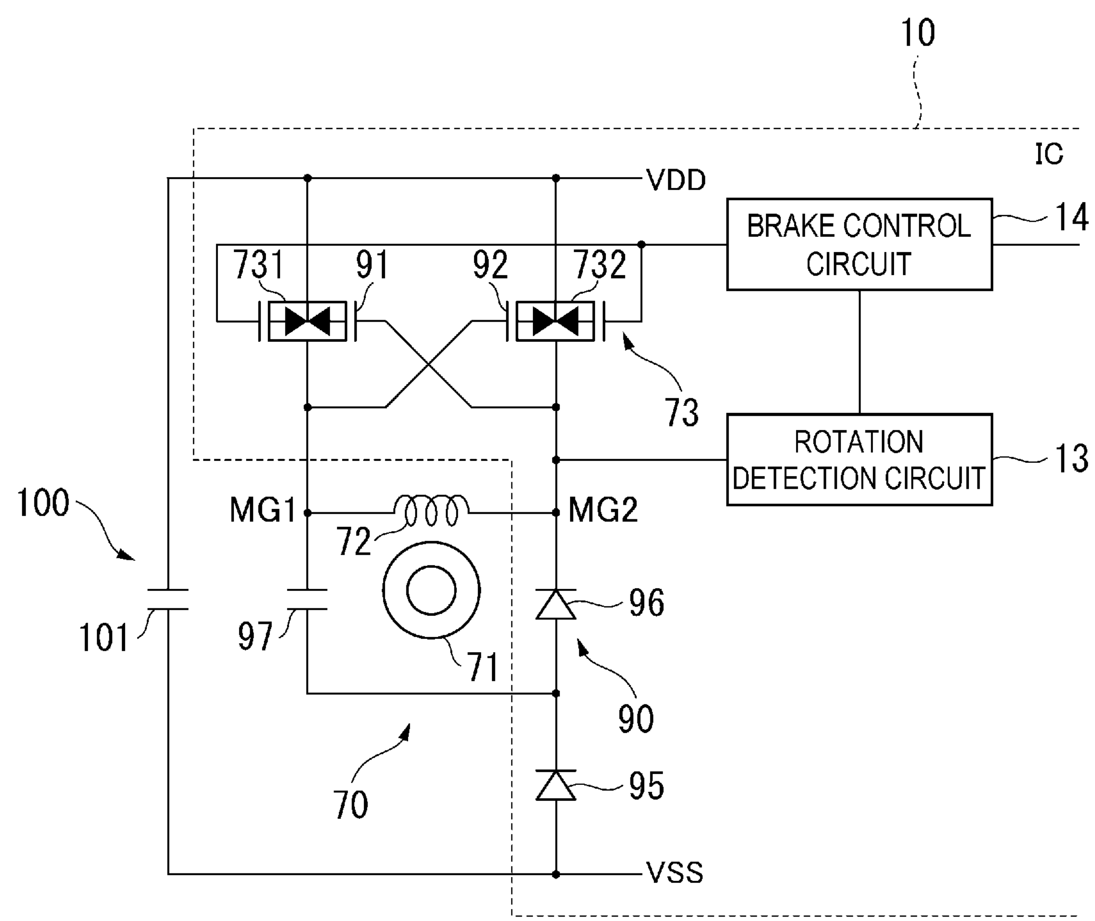
FIG. 3 is a circuit diagram illustrating a schematic configuration of main portions of the watch according to the first embodiment.

FIG. 3 is a block diagram illustrating a schematic configuration of main portions of the watch 1.

As illustrated in FIG. 3, the power generator 70 is provided with the rotor 71 and a coil 72 that generates an induced voltage VC in accordance with the rotation of the rotor 71, and supplies electrical energy. The rotor 71 is driven by the mainspring 40 via the train wheel 50. The rotor 71 is a rotor or the like that is magnetized to form two poles, and a part of the rotor 71 is configured by a magnet. The power generator 70 generates power by generating the induced voltage VC in the coil 72 as a result of a magnetic flux changing due to the rotation of the rotor 71.

A brake circuit 73 controlled by a brake control circuit 14, and the rectifier circuit 90 are coupled to output terminals MG1 and MG2 of the coil 72 of the power generator 70. Thus, the electrical energy supplied from the power generator 70 is stored in a capacitor 101 of the power supply circuit 100 via the rectifier circuit 90. In other words, the power supply circuit 100 is provided with the capacitor 101 and is configured to be rechargeable. Then, the power generation voltage generated at both ends of the capacitor 101 drives the IC 10.

Brake Circuit

In order to cause the power generator 70 to function as a speed regulator, the brake circuit 73 applies braking to the rotation of the rotor 71. The brake circuit 73 includes a first chopper transistor 731 coupled to the output terminal MG1 from which an alternating current (AC) signal generated by the power generator 70 is output, and a second chopper transistor 732 coupled to the output terminal MG2 from which the AC signal is output. Then, by turning on each of the chopper transistors 731 and 732, the output terminals MG1 and MG2 are shorted into a closed loop state, and a short brake is applied to the power generator 70.

Each of the chopper transistors 731 and 732 is coupled to an input terminal side of the power supply circuit 100.

Each of the chopper transistors 731 and 732 is configured by a p-channel field-effect transistor. A brake control signal is input from the brake control circuit 14 to agate of each of the chopper transistors 731 and 732. Thus, each of the chopper transistors 731 and 732 is maintained in an on state while the brake control signal is at an L level. On the other hand, while the brake control signal is at an H level, each of the chopper transistors 731 and 732 is maintained in an off state, and the brake is not applied to the power generator 70. In other words, the turning on and off of each of the chopper transistors 731 and 732 is controlled depending on the level of the brake control signal, and chopper control can be performed with respect to the power generator 70.

Here, the brake control signal is, for example, a signal of 128 Hz, and a brake force of the power generator 70 is adjusted by changing a duty ratio. In other words, when a period at the L level becomes longer in one cycle of the brake control signal, the period in which each of the chopper transistors 731 and 732 is maintained in the on state and the short brake is applied is also longer, and the brake force increases. On the other hand, when the period at the L level becomes shorter in one cycle of the brake control signal, the brake force decreases. Therefore, the brake force can be adjusted by the duty ratio of the brake control signal.

Rectifier Circuit

The rectifier circuit 90 is configured by a boost rectifier, a full-wave rectifier, a half-wave rectifier, a transistor rectifier or the like, and boosts and rectifies the AC output from the power generator 70 and supplies a charge to the power supply circuit 100.

The rectifier circuit 90 according to the present embodiment includes a first rectifying switch 91, a second rectifying switch 92, a diode 95, a diode 96, and a boost capacitor 97.

The first rectifying switch 91 is configured by a first rectifying transistor that is coupled in parallel with the first chopper transistor 731 of the brake circuit 73, and a gate of the first rectifying transistor is coupled to the output terminal MG2.

Similarly, the second rectifying switch 92 is configured by a second rectifying transistor that is coupled in parallel with the second chopper transistor 732, and a gate of the second rectifying transistor is coupled to the output terminal MG1. Each of these rectifying transistors is also configured by a p-channel field effect transistor.

It is sufficient that each of the diodes 95 and 96 is a unidirectional element that causes current to flow in one direction, and may be any type thereof. In particular, because an electromotive voltage of the power generator 70 is small in the watch 1 configured as the electronically controlled mechanical watch, a Schottky barrier diode or a silicon diode having a small drop voltage or reverse leakage current is preferably used as each of the diodes 95 and 96.

Note that, in the present embodiment, the first chopper transistor 731, the second chopper transistor 732, the first rectifying switch 91, the second rectifying switch 92, the diode 95, and the diode 96 are configured inside the IC 10, and the rotor 71 and the coil 72 of the power generator 70, the boost capacitor 97, and the power supply circuit 100 are provided outside the IC 10. By configuring some of the portions of the rectifier circuit 90 inside the IC 10 in this way, effects are obtained in that elements mounted on a circuit board of the watch 1 can be reduced and costs can be reduced.

Note that a capability, i.e. size, of each of the chopper transistors 731 and 732 may be set on the basis of the current at the time of chopping in the power generator 70.

Because this type of the rectifier circuit 90 includes the boost capacitor 97, in the course of the charging, the capacitor 101 of the power supply circuit 100 is charged using the charge with which the boost capacitor 97 is charged. Thus, the voltage that can be applied to the IC 10 is also increased, and stable operation of the IC 10 can be achieved. Note that, in the present embodiment, the rectifier circuit 90 is a two-stage boost rectifier circuit, but a diode or capacitor can be used to increase the number of boost stages to three or four stages or the like, and the voltage of the power supply circuit 100 can be increased.

IC

Returning to FIG. 2, the IC 10 is provided with an oscillation circuit 11, a divider circuit 12, a rotation detection circuit 13, the brake control circuit 14, a first voltage detection circuit 15, an oscillation stop detection circuit 16, and a temperature compensation function unit 20. Note that IC is an abbreviation for Integrated Circuit.

The oscillation circuit 11 configures a crystal oscillation circuit 110, together with the crystal oscillator 80. Thus, when a power supply voltage V, which is the voltage of the capacitor 101 of the power supply circuit 100, falls below an oscillation stop voltage V2, the crystal oscillation circuit 110 stops oscillating, and the crystal oscillation circuit 110 starts to oscillate when the power supply voltage V exceeds an oscillation start voltage V3.

Further, the oscillation circuit 11 outputs, to the divider circuit 12, an oscillation signal of a predetermined frequency that is generated by the oscillation of the crystal oscillator 80. In the present embodiment, the oscillation circuit 11 generates an oscillation signal of 32768 Hz. Further, the oscillation stop voltage V2 is lower than the oscillation start voltage V3. Note that a detailed operation of the oscillation circuit 11 will be described later.

The divider circuit 12 creates a reference signal fs1 of a predetermined frequency by dividing an output of the oscillation circuit 11. In the present embodiment, the divider circuit 12 creates the reference signal fs1 of 1 Hz. Then, the divider circuit 12 outputs the reference signal fs1 to the brake control circuit 14. Further, the divider circuit 12 generates a signal of a predetermined cycle by combining the signals obtained by dividing the output of the oscillation circuit 11, and outputs the obtained signal to the first voltage detection circuit 15, and a temperature compensation function control circuit 21 to be described later.

The rotation detection circuit 13 is configured by a waveform shaping circuit (not illustrated) and a multivibrator (not illustrated) coupled to the power generator 70, and outputs, to the brake control circuit 14, a rotation detection signal FG1 indicating a rotational frequency of the rotor 71 of the power generator 70.

The brake control circuit 14 compares the rotation detection signal FG1 output from the rotation detection circuit 13 with the reference signal fs1 output from the divider circuit 12, and outputs, to the brake circuit 73 of the power generator 70, a brake control signal to perform speed control of the power generator 70.

Note that, in the present embodiment, the reference signal fs1 is a signal that is aligned with a reference rotational speed of the rotor 71 during normal operation of the hands. Accordingly, the brake control circuit 14 adjusts the brake force generated by the brake circuit 73 and controls the rotation of the rotor 71, by outputting the brake control signal in accordance with the difference between the rotation detection signal FG1 and the reference signal fs1 corresponding to the rotational speed of the rotor 71.

The first voltage detection circuit 15 detects the power supply voltage V of the capacitor 101 of the power supply circuit 100 at a predetermined cycle based on the signal output from the divider circuit 12. Then, when the power supply voltage V of the capacitor 101 exceeds a cancellation voltage V1 that is set to be higher than the oscillation start voltage V3, a cancellation signal D1 output to the temperature compensation function control circuit 21, which will be described later, is switched to High. Note that the cancellation voltage V1 is an example of a first voltage of the present disclosure.

The oscillation stop detection circuit 16 is configured to be able to detect the stopping of the oscillation of the crystal oscillation circuit 110, by monitoring a signal output from the oscillation circuit 11 or the divider circuit 12. Then, upon detecting the stopping of the oscillation of the crystal oscillation circuit 110, the oscillation stop detection circuit 16 switches an oscillation stop signal D2 output to the temperature compensation function control circuit 21 to High.

Further, the oscillation stop detection circuit 16 switches the oscillation stop signal D2 to Low when the power supply circuit 100 is charged from a state in which the IC 10 is stopped and the crystal oscillation circuit 110 starts to oscillate.

Temperature Compensation Function Unit

The temperature compensation function unit 20 compensates for temperature characteristics of the crystal oscillator 80 and the like to suppress variations in the oscillation frequency, and is provided with the temperature compensation function control circuit 21 and a temperature compensation circuit 30.

Figure 4:
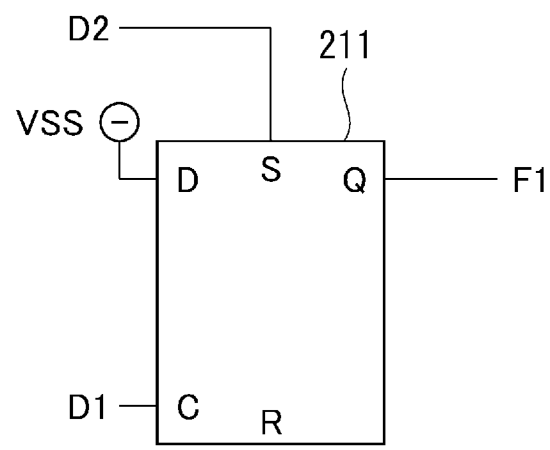
FIG. 4 is a circuit diagram schematically illustrating a storage circuit according to the first embodiment.
Figure 4:
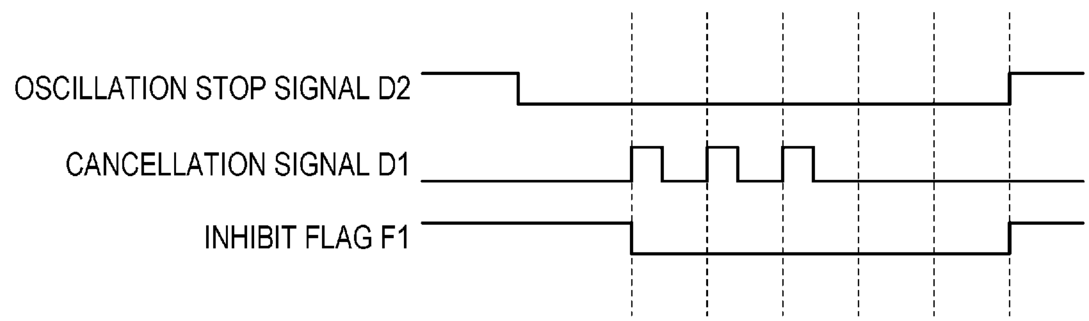

The temperature compensation function control circuit 21 controls the operation of the temperature compensation circuit 30. Further, in the present embodiment, the temperature compensation function control circuit 21 is provided with a storage circuit 211 illustrated in FIG. 4.

The storage circuit 211 is configured by a D flip-flop, for example. Then, when the oscillation stop signal D2 input to the storage circuit 211 is High, the temperature compensation function control circuit 21 initializes the storage circuit 211. In this way, the storage circuit 211 forces an inhibit flag F1 to be High, that is, generates the inhibit flag F1. While the inhibit flag F1 is generated in the storage circuit 211, the temperature compensation function control circuit 21 stops the temperature compensation function operation of the temperature compensation circuit 30, which will be described later.

Further, when the cancellation signal D1 becomes High in a state in which the oscillation stop signal D2 is Low, the storage circuit 211 stores information indicating that the cancellation signal D1 is High. In other words, the storage circuit 211 stores information indicating that the power supply voltage V has exceeded the cancellation voltage V1. Then, when the storage circuit 211 stores the information that the cancellation signal D1 is High, the storage circuit 211 cancels the inhibit flag F1. When the inhibit flag F1 is canceled by the storage circuit 211, the temperature compensation function control circuit 21 starts the temperature compensation function operation of the temperature compensation circuit 30. In other words, the temperature compensation function control circuit 21 stops the temperature compensation function operation of the temperature compensation circuit 30 until it is detected that the supply voltage V has exceeded the cancellation voltage V1. Then, the temperature compensation function control circuit 21 continues the temperature compensation function operation of the temperature compensation circuit 30 until the oscillation stop signal D2 input to the storage circuit 211 becomes High. In other words, when the cancellation signal D1 becomes High and the inhibit flag F1 is canceled, the inhibit flag F1 is maintained at Low even if the cancellation signal D1 becomes Low. Note that the temperature compensation function control circuit 21 is an example of a control circuit of the present disclosure.

Returning to FIG. 2, the temperature compensation circuit 30 is provided with a temperature sensor 31, a temperature correction table storage unit 32, an individual difference correction data storage unit 33, an arithmetic circuit 35, a logic slowing/quickening circuit 36, and a frequency adjustment control circuit 37, and performs the temperature compensation function operation that compensates for variations due to the temperature or the like of the reference signal fs1 at a constant cycle. Note that, in the present embodiment, an operation of adjusting a rate in accordance with a temperature measured by the temperature sensor 31 is referred to as the temperature compensation function operation.

The temperature sensor 31 inputs, to the arithmetic circuit 35, an output corresponding to the measured temperature, that is, an output corresponding to the temperature of the environment in which the watch 1 is being used. A diode, or a CR oscillation circuit can be used as the temperature sensor 31, and a current temperature is detected on the basis of an output signal that changes using temperature characteristics of the diode or the CR oscillation circuit. In the present embodiment, the CR oscillation circuit, which is capable of immediate digital signal processing if the output signal is waveform shaped, is used as the temperature sensor 31. In other words, the frequency of the signal output from the CR oscillation circuit changes due to the environmental temperature, and the temperature is detected on the basis of the frequency. Further, when the CR oscillation circuit is configured to be driven with a constant current, a drive current of the temperature sensor 31 is determined at a constant current value, and therefore, the current value can be controlled using the design, which makes it easier to reduce the current consumption. Since low voltage driving and low current consumption are possible with the constant current driven CR oscillation circuit, the constant current driven CR oscillation circuit is suitable for use as the temperature sensor 31 when the temperature compensation function is applied to the watch 1. Note that the temperature sensor 31 is an example of a temperature measuring unit of the present disclosure.

The temperature correction table storage unit 32 stores a temperature correction table in which settings are made as to how much the rate should be compensated for at a given temperature, in the case of an ideal crystal oscillator 80, and an ideal temperature sensor 31. In other words, the temperature correction table storage unit 32 stores the temperature correction table that is common to the crystal oscillator 80 and the temperature sensor 31. Note that the temperature correction table is an example of temperature correction data of the present disclosure.

Further, individual differences due to manufacturing occur in the crystal oscillator 80 and the temperature sensor 31. Examples of the individual difference include a secondary coefficient of temperature characteristics of the crystal oscillator 80, a peak temperature of the crystal oscillator 80, a peak rate of the crystal oscillator 80, an output frequency of the temperature sensor 31, a load capacity of the oscillation circuit 11, and the like. Therefore, individual difference correction data is written into the individual difference correction data storage unit 33, and settings are stored in the individual difference correction data indicating how much to correct the individual differences, on the basis of characteristics of the crystal oscillator 80 and characteristics of the temperature sensor 31 that are measured in advance in the course of manufacture and inspection. Note that, in the present embodiment, the operation of compensating for the individual differences in the above-described crystal oscillator 80 and temperature sensor 31 during the temperature compensation function operation is referred to as an individual difference temperature compensation operation.

The temperature correction table storage unit 32 uses a mask ROM. The reason for using the mask ROM is that this is the simplest semiconductor memory, and therefore, a degree of integration can be increased and an area can be reduced.

The individual difference correction data storage unit 33 is configured by a non-volatile memory, and particularly uses FAMOS. FAMOS is used because the current value is low after writing, and data can be written at a relatively low voltage among the non-volatile memories.

The arithmetic circuit 35 uses the temperature measured by the temperature sensor 31, the temperature correction table stored in the temperature correction table storage 32, and the individual difference correction data stored in the individual difference correction data storage unit 33 to calculate a correction amount for the rate. Then, the arithmetic circuit 35 outputs a calculation result to the logic slowing/quickening circuit 36 and the frequency adjustment control circuit 37. In other words, in the temperature compensation function operation according to the present embodiment, in addition to the temperature measurement operation by the temperature sensor 31 and an operation of reading the temperature correction table from the temperature correction table storage unit 32, the individual difference temperature compensation operation is performed by performing an operation of reading the individual difference correction data from the individual difference correction data storage unit 33.

The logic slowing/quickening circuit 36 is a circuit that digitally increases or shortens the cycle of the reference signal fs1, by inputting a set or reset signal at a predetermined timing into each of division stages of the divider circuit 12. For example, if the cycle of the reference signal fs1 is shortened by approximately 30.5 μsec (1/32768 Hz) once every 10 seconds, a clock cycle will be shortened 8640 times in one day, and thus the change of the signal becomes faster by 8640 times multiplied by 30.5 μsec, that is, becomes faster by 0.264 sec. In other words, in one day, the time advances by 0.264 sec/day. Note that sec/day (s/d) is the rate, and represents a deviation in the time in one day.

As described above, the frequency adjustment control circuit 37 is a circuit that adjusts the oscillation frequency of the oscillation circuit 11 itself by adjusting an additional capacitance of the oscillation circuit 11. When the additional capacitance is increased, the oscillation frequency decreases, and thus the time can be delayed. Conversely, when the additional capacitance is reduced, the oscillation frequency increases, and thus the time can be advanced.

In this way, in the present embodiment, the logic slowing/quickening circuit 36 and the frequency adjustment control circuit 37 are combined to adjust the rate.

Control Method for Temperature Compensation Processing

Next, a control method for temperature compensation processing according to the present embodiment will be described using a flowchart illustrated in FIG. 5.

Figure 5:
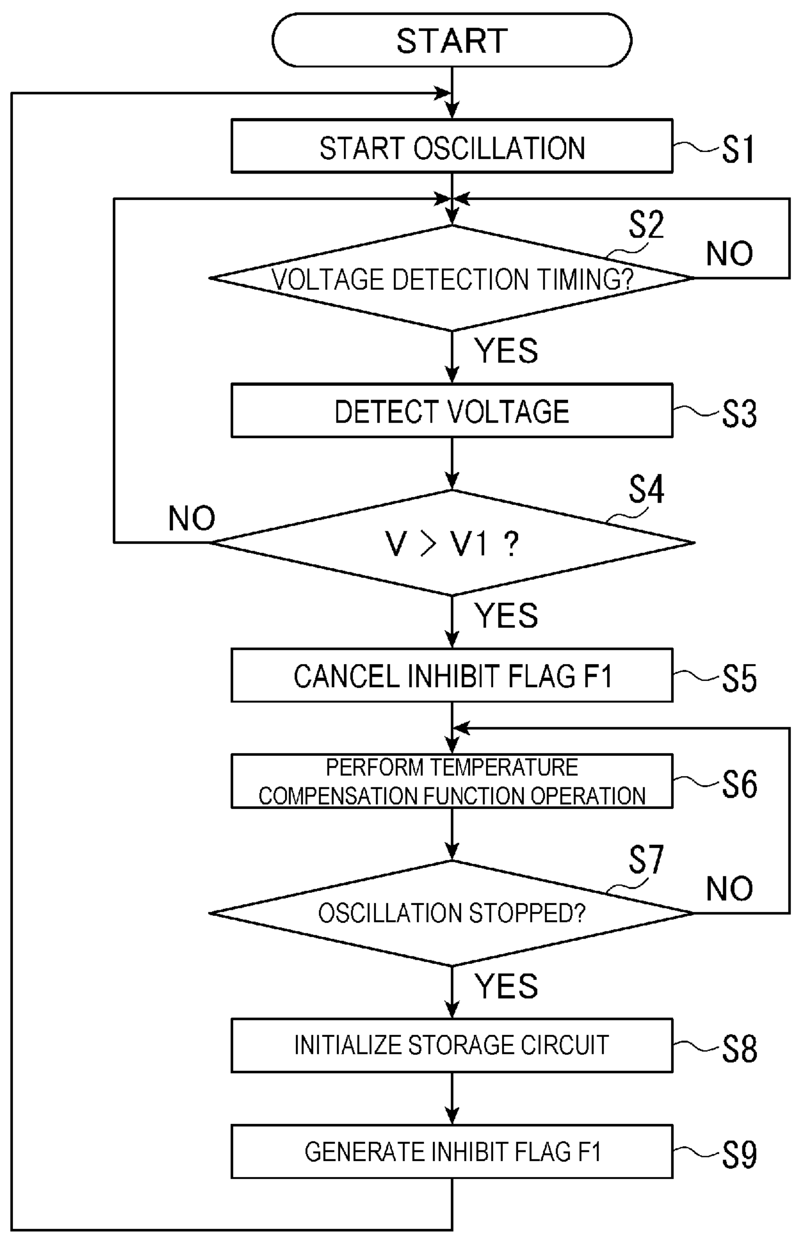
FIG. 5 is a flowchart describing a control method for temperature compensation processing according to the first embodiment.

As illustrated in FIG. 5, when the mainspring 40 is wound up from a state in which the mainspring 40 is unwound and the IC 10 is stopped, the power generation by the power generator 70 is started. Then, when the power supply voltage V exceeds the oscillation start voltage V3, at step S1, the crystal oscillation circuit 110 starts to oscillate, and the oscillation stop signal D2 becomes Low.

Next, at step S2, the first voltage detection circuit 15 determines whether or not it is a voltage detection timing.

When NO is determined at step S2, the first voltage detection circuit 15 returns to step S2 and repeats the processing.

On the other hand, when YES is determined at step S2, the first voltage detection circuit 15 detects the power supply voltage V of the capacitor 101 at step S3. In the present embodiment, as described above, the first voltage detection circuit 15 detects the power supply voltage V of the capacitor 101 at the predetermined cycle.

Next, the first voltage detection circuit 15 determines, at step S4, whether or not the supply voltage V has exceeded the cancellation voltage V1.

Figure 6:
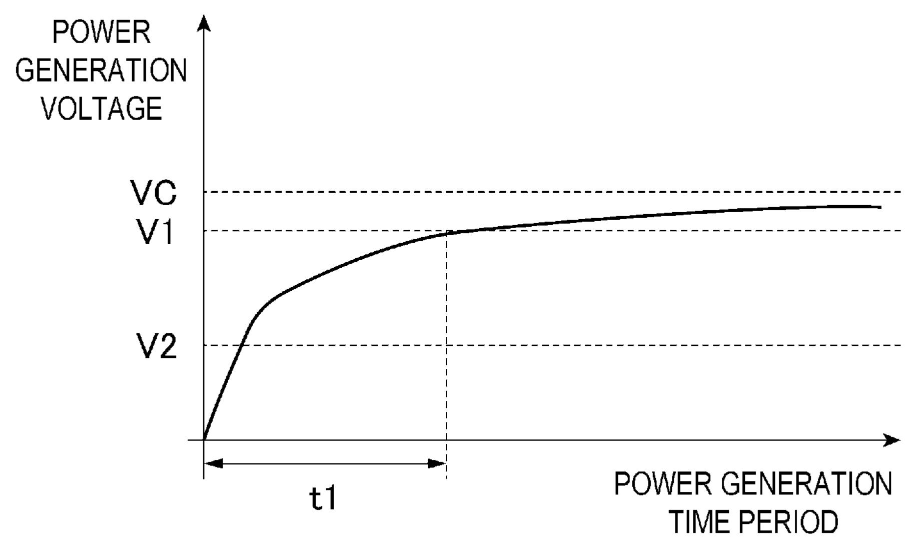
FIG. 6 is a diagram illustrating a relationship between a power generation voltage and a power generation time period.

FIG. 6 is a diagram illustrating a relationship between a power generation voltage and a power generation time period.

As illustrated in FIG. 6, when the mainspring 40 is wound up from an unwound state and the power generation is started in the power generator 70, the generated voltage gradually rises and approaches the induced voltage VC of the coil 72.

Here, when the cancellation voltage V1 is set to a value close to the induced voltage VC of the coil 72, the time period until the power supply voltage V exceeds the cancellation voltage V1 increases. In this case, the time period over which the operation of the temperature compensation circuit 30 is stopped increases, and thus, there is a risk that the desired time accuracy cannot be maintained.

On the other hand, when the cancellation voltage V1 is set to a value close to the oscillation stop voltage V2, there is a risk that, immediately after the temperature compensation function operation is started, the power supply voltage V may drop due to the temperature compensation function operation, and may fall below the oscillation stop voltage V2. In other words, there is a risk that the starting and stopping of the oscillation of the crystal oscillator 110 may be repeatedly performed.

Thus, in the present embodiment, the cancellation voltage V1 is set to be 90% or less of the induced voltage VC of the coil 72, and is set to a value at which the power supply voltage V does not fall below the oscillation stop voltage V2 as a result of the temperature compensation function operation. Specifically, the cancellation voltage V1 is set to a value that is at least several hundred mV higher than the oscillation stop voltage V2. In this way, an elapsed time period t1 from when the power generator 70 starts the power generation to when the power supply voltage V exceeds the cancellation voltage V1 can be kept within several tens of seconds, and it is possible to inhibit the power supply voltage V from falling below the oscillation stop voltage V2 due to the temperature compensation function operation, immediately after the temperature compensation function operation is started.

Note that, in the present embodiment, the above-described set value for the cancellation voltage V1 also takes into account generated voltage in a region in which a stable torque by the mainspring 40 can be obtained. In other words, as a number of turns of the mainspring 40 increases, the torque obtained increases, an inclination of the torque with respect to the number of turns of the mainspring 40 becomes small, and variations in torque become small. Therefore, the set value of the cancellation voltage V1 is set to a value of a region in which the cancellation voltage V1 exceeds the power generation voltage at which the torque necessary to operate the power generator 70, the train wheel 50, and the like using the mainspring 40 can be obtained in a stable manner, and in which the variations in the torque become small. In this way, when starting the temperature compensation function operation, the sufficient power generation voltage by the torque of the mainspring 40 can be obtained in the stable manner, and thus, the power supply voltage V that falls due to the temperature compensation function operation can be recovered.

Returning to FIG. 5, when NO is determined at step S4, the first voltage detection circuit 15 returns to step S2 and repeats the processing.

On the other hand, when YES is determined at step S4, the storage circuit 211 of the temperature compensation function control circuit 21 causes the inhibit flag F1 to be Low, that is, canceled at step S5. Specifically, when YES is determined at step S4, the first voltage detection circuit 15 switches the cancellation signal D1 to High. Then, when the cancellation signal D1 becomes High, the storage circuit 211 cancels the inhibit flag F1.

Next, the temperature compensation function control circuit 21 performs the temperature compensation function operation by the temperature compensation circuit 30 at step S6. In the present embodiment, the temperature compensation function control circuit 21 is configured to perform the temperature compensation function operation immediately after detecting the power supply voltage V at step S3. In this way, the time period from the detection of the power supply voltage V to when the temperature compensation function operation is performed can be shortened. As a result, it is possible to suppress voltage variations occurring in the period from the detection of the power supply voltage V to when the temperature compensation function operation is performed, and to suppress the operations of the IC 10 from becoming unstable.

Then, the oscillation stop detection circuit 16 determines, at step S7, whether or not the oscillation circuit 11 has stopped oscillating.

When NO is determined at step S7, the oscillation stop detection circuit 16 returns to step S6 and repeats the processing. That is, when the inhibit flag F1 is canceled, the temperature compensation function control circuit 21 causes the temperature compensation function operation to be performed at the prescribed cycle on the basis of the signal from the divider circuit 12.

On the other hand, when YES is determined at step S7, the temperature compensation function control circuit 21 initializes the storage circuit 211 at step S8. Specifically, when YES is determined at step S7, the oscillation stop detection circuit 16 switches the output of the oscillation stop signal D2 to High. Then, when the oscillation stop signal D2 becomes High, the temperature compensation function control circuit 21 initializes the storage circuit 211.

Next, the storage circuit 211 of the temperature compensation function control circuit 21 generates the inhibit flag F1 at step S9. Specifically, the storage circuit 211 generates the inhibit flag F1 when initialized. This causes the temperature compensation function control circuit 21 to stop the temperature compensation function operation by the temperature compensation circuit 30. Then, the processing is returned to step S1 and is repeated. In other words, the crystal oscillation circuit 110 stops oscillating until the mainspring 40 is wound up, the power generation by the power generator 70 is started, and the power supply voltage V exceeds the oscillation start voltage V3.

Here, in the present embodiment, the temperature compensation circuit 30 is configured to adjust a peak rate of the crystal oscillator 80, using the individual difference correction data stored in the individual difference correction data storage unit 33, that is, is able to perform an individual difference correction function operation to correct individual differences of the crystal oscillator 80, without performing the temperature measurement by the temperature sensor 31. Then, if the temperature compensation function control circuit 21 stops the temperature compensation function operation, the temperature compensation function control circuit 21 continues the individual difference correction function operation by the temperature compensation circuit 30. In other words, the temperature compensation function control circuit 21 continues the adjustment of the peak rate on the basis of the individual difference correction data.

This is because, in comparison to the power required when the temperature is measured by the temperature sensor 31, and the compensation amount corresponding to the measured temperature is read out from the temperature correction table storage unit 32 and the individual difference correction data storage unit 33, the power required to read the individual difference correction data from the individual difference correction data storage unit 33 without performing the temperature measurement by the temperature sensor 31 is significantly lower. In other words, even if the adjustment of the peak rate on the basis of the individual difference correction data is performed immediately after the oscillation of the crystal oscillator 80 has started, the power supply voltage V is not likely to fall below the oscillation stop voltage V2, and thus, the adjustment of the peak rate on the basis of the individual difference correction data, that is, the individual difference correction function operation, is continued.

Figure 7:
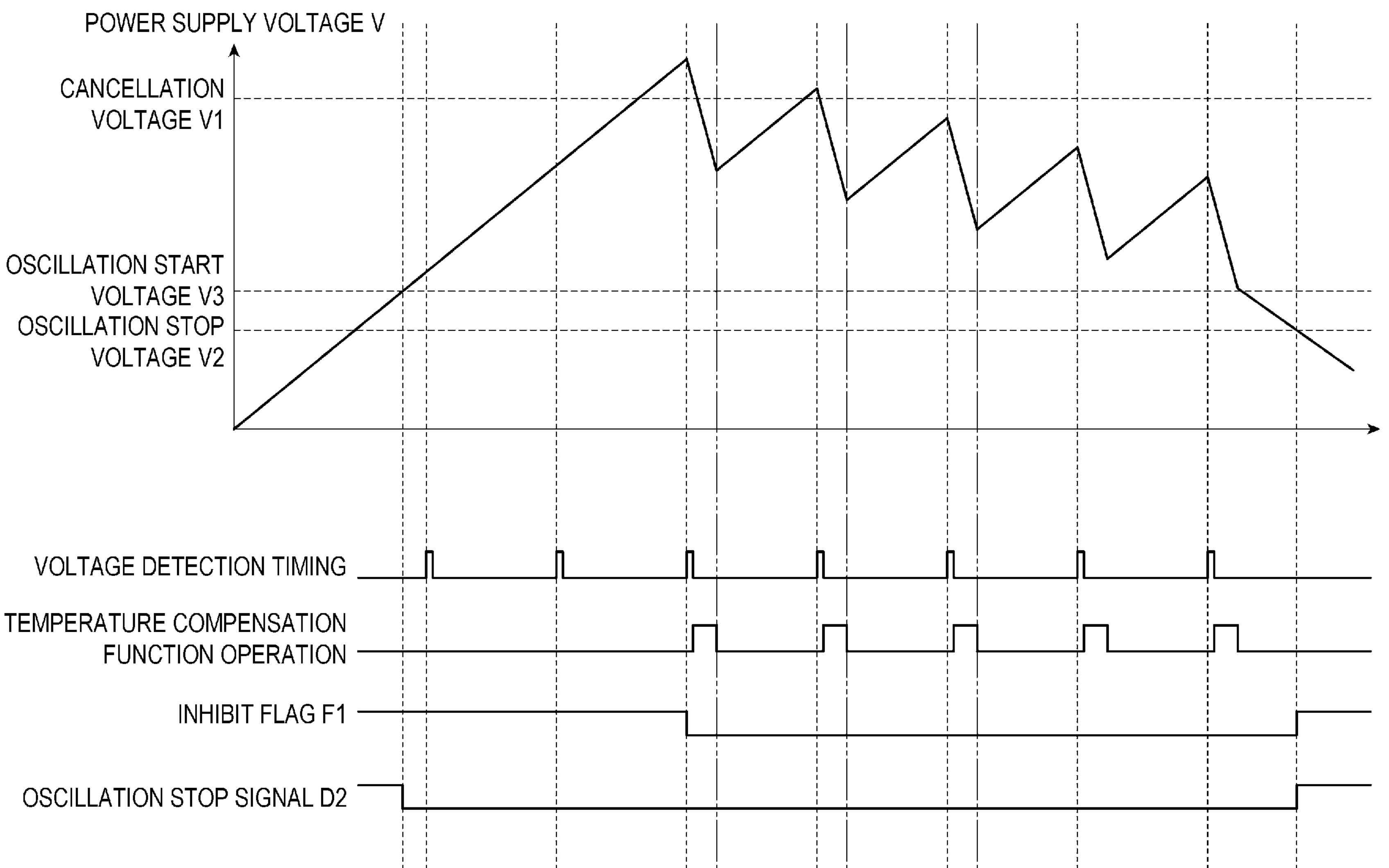
FIG. 7 is a timing chart describing the control method for the temperature compensation processing according to the first embodiment.

FIG. 7 is a timing chart describing the control method for the temperature compensation processing according to the present embodiment.

As illustrated in FIG. 7, when the mainspring 40 is wound up and the power generation by the power generator 70 starts, the power supply voltage V of the capacitor 101 gradually increases. Then, when the power supply voltage V exceeds the oscillation start voltage V3, the crystal oscillation circuit 110 starts to oscillate, and the oscillation stop signal D2 becomes Low.

Then, the power supply voltage V rises further, and when it is detected, at a voltage detection timing, that the power supply voltage V has exceeded the cancellation voltage V1, the inhibit flag F1 is canceled. In this way, the temperature compensation function operation is started. When the temperature compensation function operation is performed, the power supply voltage V temporarily falls, but as described above, the cancellation voltage V1 is set to a value sufficiently higher than the oscillation stop voltage V2, and thus, the power supply voltage V does not fall below the oscillation stop voltage V2.

Note that, as described above, the adjustment of the peak rate on the basis of the individual difference correction data is performed even during the period up to when the power supply voltage V exceeds the cancellation voltage V1. In other words, even if the inhibit flag F1 is generated, the individual difference correction function operation is performed.

Further, in the present embodiment, after the power supply voltage V exceeds the cancellation voltage V1, the voltage falls due to the temperature compensation function operation, and even if the voltage falls below the cancellation voltage V1, the storage circuit 211 is not initialized until the voltage falls below the oscillation stop voltage V2. That is, since the inhibit flag Fl is not generated, the temperature compensation function operation is continued.

Thereafter, when the power supply voltage V falls, and it is detected that the power supply voltage V is below the oscillation stop voltage V2 and the crystal oscillation circuit 110 stops oscillating, the oscillation stop signal D2 becomes High, and the inhibit flag F1 is generated. In this way, the temperature compensation function operation of the temperature compensation circuit 30 by the temperature compensation function control circuit 21 is stopped.

Advantageous Effects of First Embodiment

According to the present embodiment, the following advantageous effects can be obtained.

In the present embodiment, the temperature compensation function control circuit 21 stops the temperature compensation function operation of the temperature compensation circuit 30 until the first voltage detection circuit 15 detects that the power supply voltage V has exceeded the cancellation voltage V1.

Therefore, the temperature compensation function operation can be prevented from being performed when the charge is not sufficiently accumulated in the capacitor 101. Thus, when the temperature compensation function operation is performed, the charge accumulated in the capacitor 101 is discharged, and the power supply voltage V is lowered. It is thus possible to suppress the operation of the watch 1 from becoming uncontrollable.

In the present embodiment, the temperature compensation function control circuit 21 starts the temperature compensation function operation of the temperature compensation circuit 30 when the first voltage detection circuit 15 detects that the power supply voltage V has exceeded the cancellation voltage V1. Then, the temperature compensation function control circuit 21 continues the temperature compensation function operation even when the power supply voltage V falls below the cancellation voltage V1.

In this way, it is possible to inhibit the starting and the stopping of the temperature compensation function operation from being repeatedly performed. As a result, the time period for performing the temperature compensation function operation is shortened, and it is thus possible to suppress a situation in which the desired time accuracy cannot be maintained.

In the present embodiment, the temperature compensation function control circuit 21 is provided with the storage circuit 211 that stores the information indicating that the first voltage detection circuit 15 has detected that the power supply voltage V has exceeded the cancellation voltage V1. The temperature compensation function control circuit 21 initializes the storage circuit 211 when the stopping of the oscillation of the crystal oscillation circuit 110 is detected by the oscillation stop detection circuit 16. Then, when the storage circuit 211 is initialized, the temperature compensation function control circuit 21 stops the temperature compensation function operation of the temperature compensation circuit 30.

In this way, the temperature compensation function control circuit 21 continues the temperature compensation function operation until the stopping of the oscillation of the crystal oscillation circuit 110 is detected. As a result, it is possible to more reliably inhibit the starting and the stopping of the temperature compensation function operation from being repeatedly performed.

In the present embodiment, the temperature compensation function control circuit 21 continues the individual difference correction function operation when the temperature compensation function operation of the temperature compensation circuit 30 is stopped.

In this way, during the period from the start of the power generation by the power generator 70 until the power supply voltage V exceeds the cancellation voltage V1, even if the inhibit flag F1 is generated, the adjustment of the peak rate on the basis of the individual difference correction data is performed. As a result, the desired time accuracy can be more reliably maintained.

In the present embodiment, the cancellation voltage V1 is set such that, when the temperature compensation function operation of the temperature compensation circuit 30 is started by the temperature compensation function control circuit 21, the power supply voltage V does not fall below the oscillation stop voltage V2 as a result of the temperature compensation function operation.

In this way, it is possible to inhibit the crystal oscillation circuit 110 from stopping oscillating as a result of the power supply voltage V falling below the oscillation stop voltage V2 immediately after the temperature compensation function operation is started.

Further, in the present embodiment, the cancellation voltage V1 is set to exceed the generated voltage at which the torque required to operate the power generator 70, the train wheel 50, and the like by the mainspring 40 is obtained in a stable manner. In this way, the power supply voltage V that falls as a result of the temperature compensation function operation can be recovered.

Second Embodiment

Next, a second embodiment of the present disclosure will be described with reference to FIG. 8 to FIG. 10. In the second embodiment, a temperature compensation function control circuit 21A differs from the first embodiment described above in that the temperature compensation function operation by the temperature compensation circuit 30 is stopped when the power supply voltage V falls below a programmed voltage V4.

Note that, in the second embodiment, the same or similar components as or to those of the first embodiment will be given the same reference signs and detailed descriptions thereof will be omitted or simplified.

Figure 8:
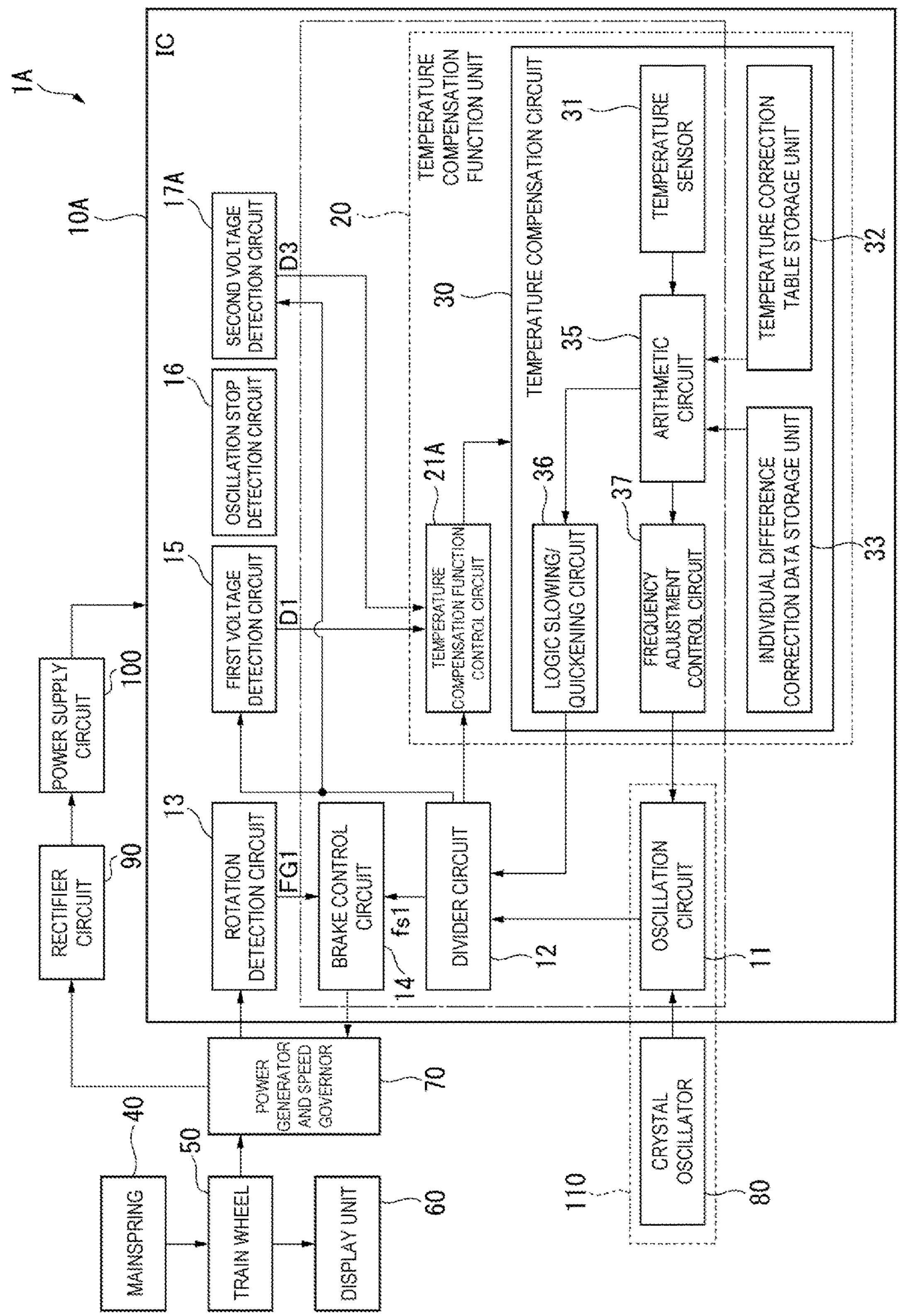
FIG. 8 is a circuit diagram illustrating a schematic configuration of a watch according to a second embodiment.

FIG. 8 is a block diagram illustrating a schematic configuration of a watch 1A according to the second embodiment.

As shown in FIG. 8, an IC 10A is provided with a second voltage detection circuit 17A.

The second voltage detection circuit 17A detects the power supply voltage V of the power supply circuit 100 at a predetermined cycle on the basis of the signal output from the divider circuit 12. Then, when the power supply voltage V of the capacitor 101 falls below the preset programmed voltage V4, an inhibit flag generation signal D3 output to the temperature compensation function control circuit 21A is set to High.

In the present embodiment, the programmed voltage V4 is set to be higher than the oscillation start voltage V3 and to be lower than the cancellation voltage V1. Note that the programmed voltage V4 is an example of a second voltage of the present disclosure.

Figure 9:
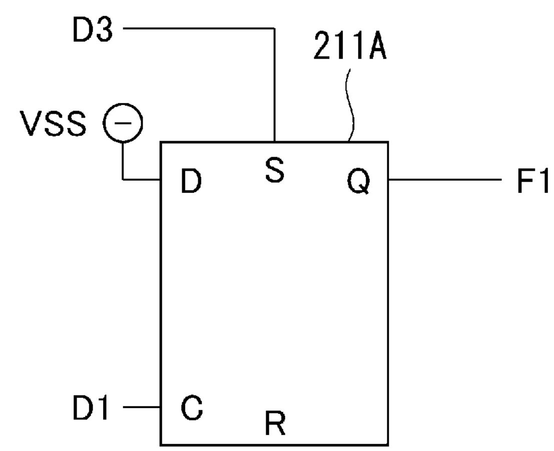
FIG. 9 is a circuit diagram schematically illustrating a storage circuit according to the second embodiment.
Figure 9:
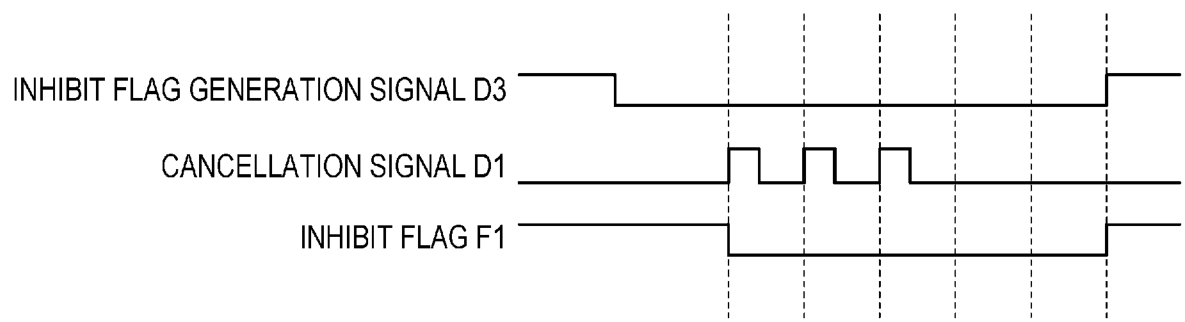

The temperature compensation function control circuit 21A is provided with a storage circuit 211A illustrated in FIG. 9.

In a similar manner to the first embodiment described above, the storage circuit 211A is configured by a D flip-flop. Then, when the inhibit flag generation signal D3 input to the storage circuit 211A becomes High, the temperature compensation function control circuit 21A initializes the storage circuit 211A. In this way, the storage circuit 211A forces the inhibit flag F1 to be High, that is, generates the inhibit flag F1.

Further, when the cancellation signal D1 becomes High in a state in which the inhibit flag generation signal D3 is Low, the storage circuit 211A stores information indicating that the cancellation signal D1 has become High. In other words, the storage circuit 211A stores information indicating that the supply voltage V has exceeded the cancellation voltage V1. Then, when the storage circuit 211A stores information indicating that the cancellation signal D1 has become High, the storage circuit 211A cancels the inhibit flag F1.

Control Method for Temperature Compensation Processing

Next, a control method for temperature compensation processing according to the present embodiment will be described using a flowchart illustrated in FIG. 10.

Note that, in the present embodiment, steps S1A to S6A are the same as steps S1 to S6 of the first embodiment described above, and a description thereof will thus be omitted.

Figure 10:
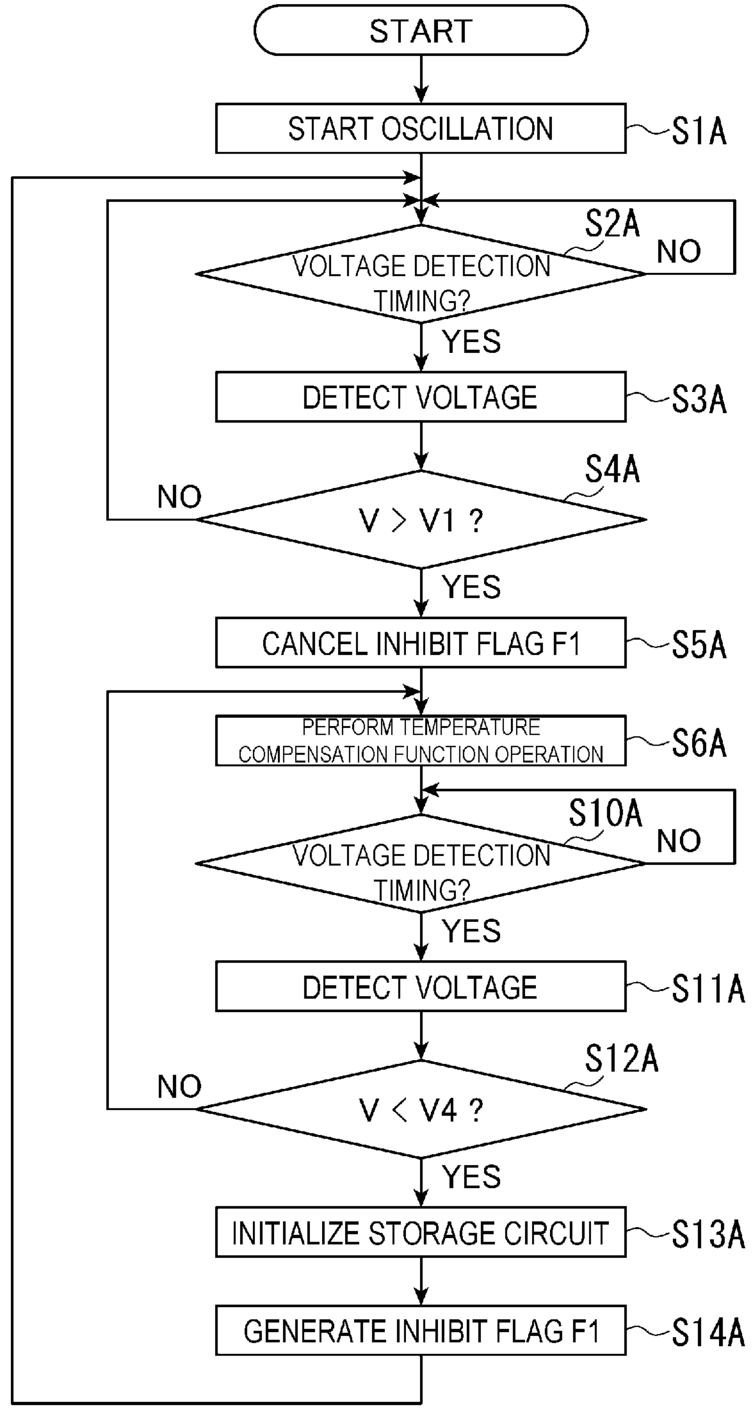
FIG. 10 is a flowchart describing a control method for temperature compensation processing according to the second embodiment.

As illustrated in FIG. 10, at step S10A, the second voltage detection circuit 17A determines whether or not it is a voltage detection timing.

When NO is determined at step S10A, the second voltage detection circuit 17A returns to step S10A and repeats the processing.

On the other hand, when YES is determined at step S10A, the second voltage detection circuit 17A detects the power supply voltage V of the capacitor 101 at step S11A. In the present embodiment, as described above, the second voltage detection circuit 17A detects the power supply voltage V of the capacitor 101 at a predetermined cycle.

Next, the second voltage detection circuit 17A determines, at step 512A, whether or not the power supply voltage V of the capacitor 101 has fallen below the programmed voltage V4.

When NO is determined at step 512A, the processing is returned to step S6A and is repeated.

On the other hand, when YES is determined at step 512A, the temperature compensation function control circuit 21A initializes the storage circuit 211A at step S13A. Specifically, when YES is determined at step S12A, the second voltage detection circuit 17A switches the inhibit flag generation signal D3 to High. Then, when the inhibit flag generation signal D3 becomes High, the temperature compensation function control circuit 21A initializes the storage circuit 211A. Then, the storage circuit 211A generates the inhibit flag F1 at step S14A.

After that, the processing returns to step S2A and is repeated.

Figure 11:
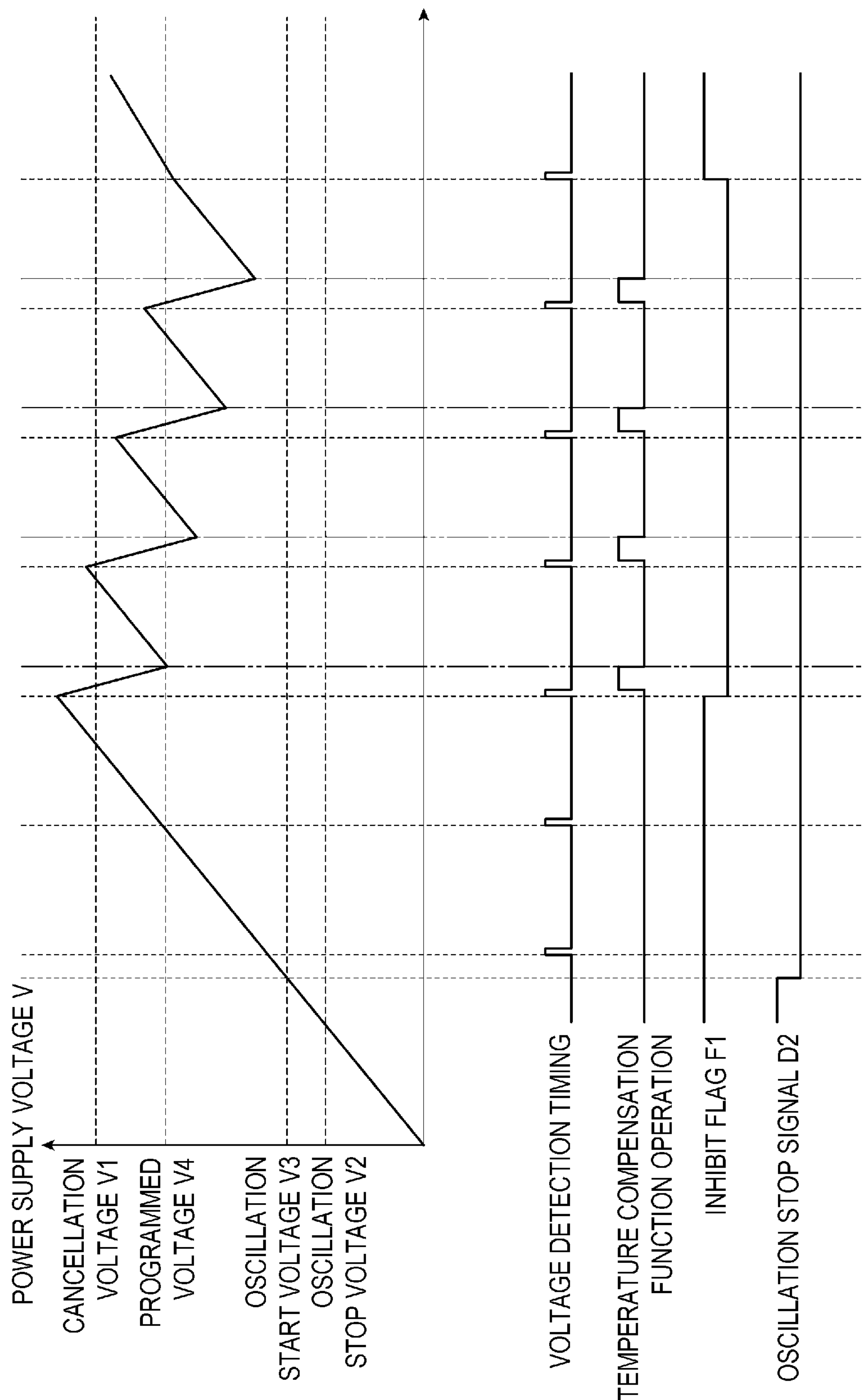
FIG. 11 is a timing chart describing the control method for the temperature compensation processing according to the second embodiment.

FIG. 11 is a timing chart describing the control method for the temperature compensation processing according to the present embodiment.

As illustrated in FIG. 11, after the inhibit flag F1 is canceled, when it is detected, at a voltage detection timing, that the power supply voltage V has fallen below the programmed voltage V4, the inhibit flag F1 is generated. In this way, the temperature compensation function control circuit 21A stops the temperature compensation function operation of the temperature compensation circuit 30.

Advantageous Effects of Second Embodiment

According to the present embodiment, the following advantageous effects can be obtained.

In the present embodiment, the second voltage detection circuit 17A is provided that detects that the supply voltage V has fallen below the programmed voltage V4. Then, when it is detected by the second voltage detection circuit 17A that the power supply voltage V has fallen below the programmed voltage V4, the temperature compensation function control circuit 21A stops the temperature compensation function operation of the temperature compensation circuit 30.

In this way, the power supply voltage V is less likely to experience a voltage drop as a result of the temperature compensation function operation, and it is thus possible to increase a time period until the power supply voltage V falls below the oscillation stop voltage V2. In other words, the duration of the watch 1A can be increased.

In the present embodiment, the temperature compensation function control circuit 21A initializes the storage circuit 211A when the second voltage detection circuit 17A detects that the power supply voltage V has fallen below the programmed voltage V4. Then, when the storage circuit 211A is initialized, the temperature compensation function control circuit 21A stops the temperature compensation function operation of the temperature compensation circuit 30.

Thus, the temperature compensation function control circuit 21A continues the temperature compensation function operation until the supply voltage V falls below the programmed voltage V4. Thus, in a similar manner to the first embodiment described above, it is possible to more reliably inhibit the starting and stopping of the temperature compensation function operation from being repeatedly performed.

MODIFIED EXAMPLE

Note that the present disclosure is not limited to each of the embodiments described above, and variations, modifications, and the like within the scope in which the object of the present disclosure can be achieved are included in the present disclosure.

In the embodiments described above, the temperature compensation function control circuits 21 and 21A are respectively configured to continue the individual difference correction function operation while the inhibit flag F1 is generated, but the temperature compensation function control circuits 21 and 21A are not limited thereto. For example, the temperature compensation function control circuits 21 and 21A may be configured to stop the individual difference correction function operation while the inhibit flag F1 is generated, that is, to also stop the adjustment of the peak rate on the basis of the individual difference correction data.

In each of the embodiments described above, the temperature compensation circuit 30 is configured to include the temperature correction table storage unit 32 and the individual difference correction data storage unit 33, but the temperature compensation circuit 30 is not limited thereto. For example, the temperature compensation circuit 30 may be configured to include one of the temperature correction table storage unit 32 or the individual difference correction data storage unit 33.

In each of the embodiments described above, the temperature compensation circuit 30 is configured to combine the logic slowing/quickening circuit 36 and the frequency adjustment control circuit 37 to adjust the rate, but the temperature compensation circuit 30 is not limited thereto. For example, the temperature compensation circuit 30 may be configured to adjust the rate using one of the logic tempo circuit 36 or the frequency adjustment control circuit 37.

In the first embodiment, the storage circuit 211 of the temperature compensation function control circuit 21 is configured to store the information indicating that the release signal D1 has become High and to be initialized when the oscillation stop signal D2 becomes High, but the temperature compensation function control circuit 21 is not limited thereto. For example, the temperature compensation function control circuit 21 may be provided with a storage device that stores information indicating that the power supply voltage V has exceeded the cancellation voltage V1, and may be configured to control the temperature compensation function operation in accordance with a state of the storage device.

Furthermore, in the second embodiment, the storage circuit 211A of the temperature compensation function control circuit 21A is configured to store the information that the release signal D3 has become High, and to be initialized when the inhibit flag generation signal D3 becomes High, but the temperature compensation function control circuit 21A is not limited thereto. For example, the temperature compensation function control circuit 21A may include a storage device that stores information indicating that the power supply voltage V has exceeded the cancellation voltage V1, and may be configured to control the temperature compensation function operation in accordance with a state of the storage device.

In the second embodiment, the programmed voltage V4 is set to be higher than the oscillation start voltage V3, but the programmed voltage V4 is not limited thereto. For example, the programmed voltage V4 may be set to be equal to or less than the oscillation start voltage V3, or may be set to be higher than the oscillation stop voltage V2.

What is claimed is:

1. An electronically controlled mechanical watch comprising:

a mechanical energy source;

a power generator including a rotor driven by the mechanical energy source;

a capacitor configured to be chargeable and accumulate electrical energy generated by the power generator;

a crystal oscillation circuit including a crystal oscillator and an oscillation circuit and configured to stop oscillation when a voltage of the capacitor falls below an oscillation stop voltage, and to start oscillation and output an oscillation signal when the voltage exceeds an oscillation start voltage, which is higher than the oscillation stop voltage;

a divider circuit configured to output a reference signal by dividing the oscillation signal output from the oscillation circuit;

a temperature compensation circuit configured to perform a temperature compensation function operation that compensates for variation of the reference signal due to a temperature;

a first voltage detection circuit configured to detect that the voltage exceeded a first voltage that is set higher than the oscillation start voltage; and a control circuit configured to stop the temperature compensation function operation of the temperature compensation circuit until the first voltage detection circuit detects that the voltage exceeded the first voltage.

2. The electronically controlled mechanical watch according to claim 1, wherein the control circuit starts the temperature compensation function operation of the temperature compensation circuit when the first voltage detection circuit detects that the voltage exceeded the first voltage, and subsequently continues the temperature compensation function operation even when the voltage falls below the first voltage.

3. The electronically controlled mechanical watch according to claim 1, comprising an oscillation stop detection circuit configured to detect an oscillation stop of the crystal oscillation circuit, wherein the control circuit stops the temperature compensation function operation when the oscillation stop of the crystal oscillation circuit is detected by the oscillation stop detection circuit.

4. The electronically controlled mechanical watch according to claim 3, comprising a storage circuit configured to store detection by the first voltage detection circuit that the voltage exceeded the first voltage, wherein the control circuit initializes the storage circuit when the oscillation stop of the crystal oscillation circuit is detected by the oscillation stop detection circuit, and stops the temperature compensation function operation when the storage circuit is initialized.

5. The electronically controlled mechanical watch according to claim 1, comprising a second voltage detection circuit configured to detect that the voltage fell below a second voltage that is set lower than the first voltage, wherein the control circuit stops the temperature compensation function operation when the second voltage detection circuit detects that the voltage fell below the second voltage.

6. The electronically controlled mechanical watch according to claim 5, comprising a storage circuit configured to store detection by the first voltage detection circuit that the voltage exceeded the first voltage, wherein the control circuit initializes the storage circuit when the second voltage detection circuit detects that the voltage fell below the second voltage, and stops the temperature compensation function operation of the temperature compensation circuit when the storage circuit is initialized.

7. The electronically controlled mechanical watch according to claim 1, wherein the temperature compensation circuit is configured to perform an individual difference correction function operation that corrects an individual difference of the crystal oscillator, and the control circuit continues the individual difference correction function operation by the temperature compensation circuit when the temperature compensation function operation of the temperature compensation circuit is stopped.

8. The electronically controlled mechanical watch according to claim 1, wherein the first voltage is set such that the voltage does not fall below the oscillation stop voltage due to the temperature compensation function operation, when the control circuit starts the temperature compensation function operation of the temperature compensation circuit.

9. A method for controlling an electronically controlled mechanical watch that includes a mechanical energy source, a power generator including a rotor driven by the mechanical energy source, a capacitor configured to be chargeable and accumulate electrical energy generated by the power generator, a crystal oscillation circuit including a crystal oscillator and an oscillation circuit and configured to stop oscillation when a voltage of the capacitor falls below an oscillation stop voltage and start oscillation and output an oscillation signal when the voltage exceeds an oscillation start voltage, which is higher than the oscillation stop voltage, a divider circuit configured to output a reference signal by dividing the oscillation signal output from the oscillation circuit, a temperature compensation circuit configured to perform a temperature compensation function operation that compensates for variation of the reference signal due to a temperature, and a first voltage detection circuit configured to detect that the voltage exceeded a first voltage that is set higher than the oscillation start voltage, the control method comprising stopping the temperature compensation function operation of the temperature compensation circuit until the first voltage detection circuit detects that the voltage exceeded the first voltage.

* * * * *